United States Patent [19]

Ranke et al.

[11] Patent Number: 4,724,796
[45] Date of Patent: Feb. 16, 1988

[54] VAPORIZATION ARRANGEMENT WITH A RECTANGULAR VAPORIZATION CRUCIBLE AND SEVERAL ELECTRON GUNS

[75] Inventors: Horst Ranke, Alzenau; Volker Bauer; Albert Feuerstein, both of Neuberg; Walter Dietrich, Hanau am Main, all of Fed. Rep. of Germany

[73] Assignee: Leybold-Heraeus GmbH, Cologne, Fed. Rep. of Germany

[21] Appl. No.: 941,825

[22] Filed: Dec. 15, 1986

[30] Foreign Application Priority Data

Nov. 20, 1986 [DE] Fed. Rep. of Germany ....... 3639683

[51] Int. Cl.$^4$ .............................................. C23C 14/24
[52] U.S. Cl. ................... 118/726; 219/121 EE
[58] Field of Search .................. 118/726; 219/121 EE

[56] References Cited

U.S. PATENT DOCUMENTS

| | | | |
|---|---|---|---|
| 3,329,524 | 7/1967 | Smith | 118/726 |
| 3,390,249 | 6/1968 | Hanks | 219/121 EE |
| 3,575,132 | 4/1971 | Fransisco | 219/121 EE |
| 4,131,753 | 12/1978 | Tsujimoto | 373/11 |
| 4,238,525 | 12/1980 | Aichert | 118/50.1 |
| 4,532,888 | 8/1985 | Neumann | 118/726 |
| 4,620,081 | 10/1986 | Zeren | 118/726 |

*Primary Examiner*—Richard R. Bueker
*Attorney, Agent, or Firm*—Felfe & Lynch

[57] ABSTRACT

A vaporization arrangement for coating substrates disposed in an areal region, or past through an areal region, comprises a rectangular vaporization crucible with a crucible rim, as well as plurality of electron guns each having an X-Y deflecting system. The electron guns are disposed on one side of the drucible axis separately from the crucible in such a manner that their beam axis extend parallel to one another and are directed on a plane passing vertically through the longitudinal axis of the crucible. The arrangement further comprises means for deflecting the electron means onto the surface of the contents of the crucible. Such means include an alternating serial arrangement of linear coils, on the side of the crucible opposite to the electron guns, and pole plates disposed both between the linear coils and at their ends. The pole plates at the ends of a linear coil in each case assume such a position relative to an opposite electron gun, such that the beam axis is substantially in a perpendicular plane of symmetry between the pole plates.

3 Claims, 1 Drawing Figure

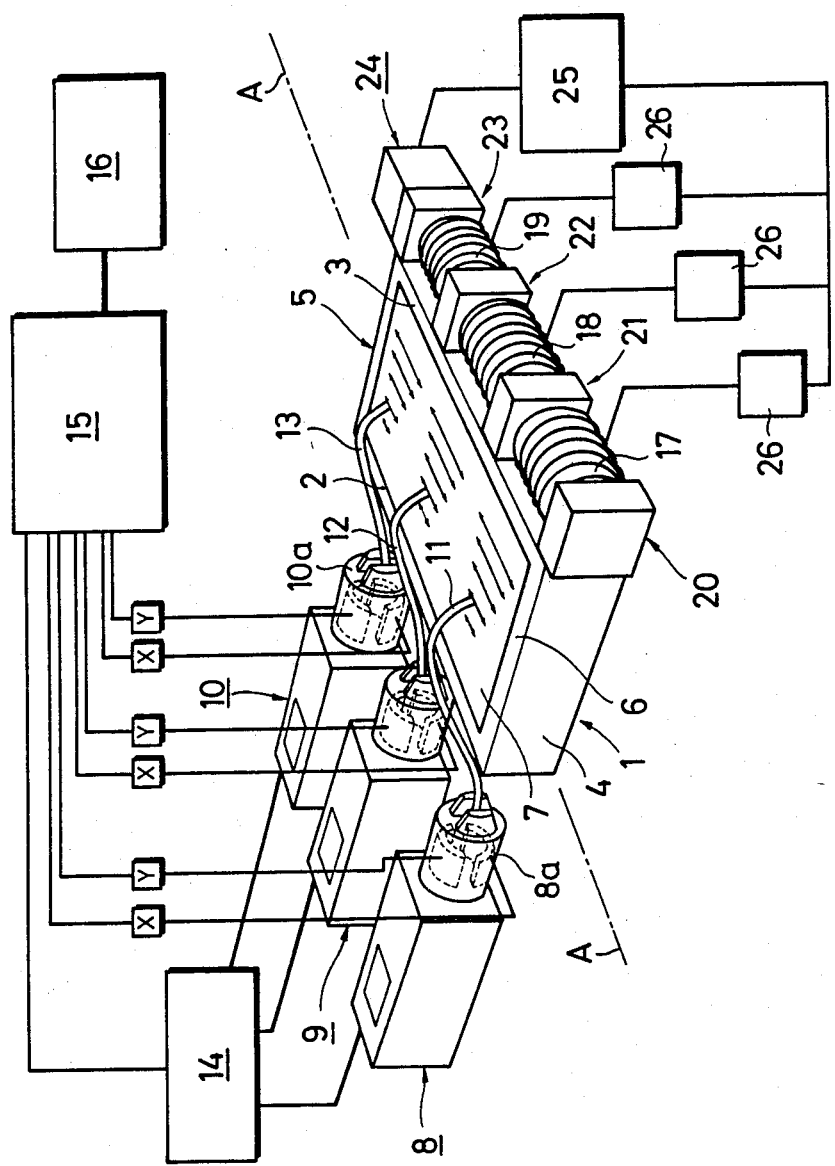

VAPORIZATION ARRANGEMENT WITH A RECTANGULAR VAPORIZATION CRUCIBLE AND SEVERAL ELECTRON GUNS

BACKGROUND OF THE INVENTION

The invention relates to a vaporization arrangement for coating substrates disposed in an areal region or passed through an areal region. The arrangement comprises a rectangular vaporization crucible with a crucible rim and a longitudinal axis, as well as a plurality of electron guns, each having an X and Y deflection system. The electron guns are disposed on one side of the crucible axis separately from the crucible in such a manner that their beam axes extend parallel to one another and are directed along planes passing vertically through the crucible axis. It is possible to deflect the electron beams by means of an additional deflecting device onto the surface of the contents of the crucible.

The German Patent No. 2,206,995, discloses an electron-beam vaporizer in which a beam generator works together with one or several vaporization crucibles, the upwardly divided openings of which are constructed circularly. To protect the sensitive cathode, the beam generator lies below the rim of the crucible and the electron beam is deflected by means of a magnetic field through 180 degrees onto the material to be vaporized or into the mouth of the crucible. The deflecting system, required for the generation of the magnetic field, is, however, disposed above a plane which passes through the rim of the crucible, so that a portion of the vapor unavoidably condenses on the deflecting system. It is known that the beam generator may be disposed to one side of and below the crucible rim, so that the electron beam must be deflected through an angle of 270 degrees in order to pass through the mouth of the crucible and strike the material to be vaporized. It is also known that the electron beam of the vaporization arrangements described above may be deflected within of the crucible mouth in such a manner that the material to be vaporized is struck periodically by the migrating electron beam (see German Auslegeschrift No. 2,047,138).

It is a common feature of all of these vaporization arrangements that they represent essentially only a quasi point source of vapor. Even if several of these vapor sources were to be mounted in a row, a highly inhomogeneous vapor stream would still be produced which would lead to a striated distribution of thicknesses when films, foils or other substrates of large surface area are coated.

The German Patent No. 2,812,285 discloses two electron guns, each with with an X-Y deflection system, with which practically the whole of the surface of the material to be vaporized may be acted upon by a defined energy distribution per surface element, and which may be assigned to a rectangular vaporization crucible with a longitudinal crucible axis. By these means, it is possible to metallize a plurality of substrates, disposed over a larger surface region, largely homogeneously with layers of alloys. For this known solution, however, the electron guns are disposed above the vaporization crucible, so that special shielding devices must be provided to ensure that the parts of the electron guns, which protrude into the vacuum chamber, are not exposed to an impermissible extent to the condensation of vapor. This known arrangement, however, is limited to the use of two electron guns. Because the possibility of deflecting the two electron beams is likewise limited, the maximum length of the crucible is therefore also limited. Moreover, vaporizing crucibles are not assigned their own magnetic field, so that a large portion of the electrons is reflected from the surface of the fused material to be vaporized; i.e., from the bath surface. As is furthermore evident from the German Patent No. 2,812,311, the reflected electrons can be utilized in an advantageous manner for additionally heating the substrates, should this be beneficial for the coating process described. However, since the substrates may not be heated to arbitrarily high temperatures, the output of the electron guns is also necessarily limited, so that the throughput of substrates through such equipment is likewise limited. Such an arrangement is totally out of the question for heat-sensitive substrates.

The state of the art also includes a vaporizing arrangement of the initially described type, in which several electron beam guns with parallel beam axes (defined by their beam control tubes) are disposed on each side of a rectangular vaporization crucible and in which the beam axes lie in mutually parallel, vertical planes, which in turn are perpendicular to a further plane that passes perpendicularly through the longitudinal crucible axis. The deflecting systems assigned to each individual electron gun here are, however, above a plane passing through the rim of the crucible, so that the deflecting systems and the outlets of the electron guns encounter vapor, reflected electrons and heat radiation. With such an arrangement also, the total electric power that can be supplied is limited, particularly since the problem also exists here that the unavoidably reflected electrons strike the substrates and components of the installation, thus heating them additionally. Likewise, no provisions have been made in this known arrangement to assign a magnetic deflecting field directly to the vaporization crucible.

It would be conceivable to provide pole plates at the narrow sides of the vaporization crucible in order to provide an additional magnetic deflecting field in the region of the vaporization crucible, by means of which the electron beams can be deflected onto the material to be vaporized. Such a possibility, however, is made difficult by the largely arch-shaped or barrel-shaped path of the lines of flux, which would lead to considerable inhomogeneities in the beam deflection. Such a vaporization arrangement therefore would have to be divided into several individual crucibles, and pole plates would have to be introduced in the spaces between the individual crucibles, in order to be able to bring about a reliable deflection of the beam. Such an arrangement is described in the German Auslegeschrift No. 2,815,627, however it leads to the disadvantage of a serial arrangement of almost point sources of vaporization.

SUMMARY OF THE INVENTION

It is therefore an object of the present invention to improve a vaporization arrangement of the type described above such that, in relation to a practically unlimited number of electron beams over the whole length of the vaporization crucible, largely identical magnetic deflecting fields can be generated for each individual electron beam, insofar as the path of the beam above the rectangular vaporization crucible is concerned.

This object is accomplished, in accordance with the invention, by disposing, on the side of the crucible opposite to the electron guns, an alternating serial arrangement of linear coils and pole plates which are between the linear coils and at their ends, two pole plates at the ends of a linear coil in each case having a position relative to an opposite electron gun such that the beam axis essentially is in a vertical plane of symmetry between the pole plates.

The pole plates are arranged outside of the rectangular outline of the crucible, so that the crucible volume is not subdivided by the pole plates and, moreover, so that there is no subdivision into individual vaporization crucibles. Admittedly, the magnetic lines of flux, originating from the pole plates disposed in accordance with the invention, also have an arch-shaped or barrel-shaped path. However, the sector from each magnetic field, working together with the respective electron beam, can be regarded as sufficiently linear and, especially with regard to each individual electron beam, largely identical. A relatively large number of electron guns can therefore be assigned to a relatively long rectangular vaporization crucible without there being an impermissible change in the vaporization characteristics over the length of the vaporization crucible as a whole.

The invention also has a series of further advantages. The vaporization arrangement can be constructed exceptionally flat, so that the distance between the substrate or the substrates and the upper rim of the crucible can be kept small. As a result of this arrangement, the yield or effectiveness of the material is improved appreciably.

The overall length of the vaporization arrangement can be increased practically at will. This is of particular advantage when broad tapes or plates are to be coated as they pass continuously through the region of the vaporization crucible.

The invention results in a serial arrangement of recurring magnetic fields of the same configuration which, aside from having a defined beam deflection, also returns reflected electrons or scattered electrons back to the material that is to be vaporized so that the electric power requirements are reduced. By these means, however, not only is the power introduced effectively into the material to be vaporized, but the thermal load on the substrate due to reflected electrons is also reduced.

The inventive vaporization arrangement permits the electron beam to strike the material to be vaporized practically perpendicularly during the vaporization. A symmetrical vaporization cone is produced by these means. The "vaporization cone", as this term is used herein, is understood to mean a volume which is correspondingly defined in the vacuum and through which the bulk of the vaporized material flows. Provided that the electron beam strikes the material to be vaporized perpendicularly, the axis of this vaporization cone is also perpendicular to the surface of the material to be vaporized and the cone axis starts out from that point at which the electron beam strikes the surface of the material to be vaporized.

In this connection, it is not at all necessary that the point of impact of the electron beam, the so-called "cathode point", be kept stationary; rather, it is possible with particular advantage to deflect this cathode point within a region assigned to the respective electron beam according to a particular pattern, as described, for example, in the German Patent No. 2,812,285. Such a region, moreover, advantageously lies between the extension of those pole plates which are assigned to an electron beam or an electron gun. It is, however, also readily possible for these regions to overlap.

In this connection, it is particularly advantageous if the pole plates and/or the electron guns are disposed completely below a horizontal plane, which passes through the rim of the crucible. The pole plates and/or the electron guns are thus protected completely against metallization or condensation of vaporized material and against a thermal load due to electrons as well as due to radiant heat.

BRIEF DESCRIPTION OF THE DRAWING

The present invention is explained in greater detail in conjunction with a block flow diagram by means of the single FIGURE, which is essentially a perspective view of the vaporization arrangement.

DESCRIPTION OF THE PREFERRED EMBODIMENT

The FIGURE shows a rectangular vaporization crucible 1 with two long sides 2 and 3 and two narrow sides 4 and 5, as well as an upper crucible rim 6, which lies in a horizontal plane. The material 7 to be vaporized, the nature and/or composition of which depends on the use to which the coated substrate is to be put (and which is not shown in the FIGURE) is in the vaporization crucible 1. The substrate or substrates should be imagined to be in a plane which extends barely above and parallel to the rim 6 of the crucible. The rim 6 of the crucible defines a crucible opening, which in turn describes an areal region, in which stationary or movable substrates are disposed. Movable substrates may, for example, comprise a film or foil or plates which are to be coated on a moving belt.

The vaporization crucible 1 has a longitudinal crucible axis A—A, only the two ends of which are indicated in the FIGURE. This crucible axis A—A runs parallel to the long sides 2 and 3, perpendicularly to the narrow sides 4 and 5 and through the rim 6 of the crucible. It will be understood that this crucible axis is merely an imaginary axis which serves only to define the geometric relationships.

Behind the long side 2, there is a serial arrangement of electron guns 8, 9 and 10, of which only the housings and the housing continuations 8a, 9a and 10a are shown. Conventional deflection units, which are like those also described, for example, in the German Patents Nos. 2,812,285 and 2,812,311, are arranged in these housing continuations. Each of these electron guns emits an electron beam 11, 12 and 13 which, initially, because of the deflecting systems present in the housing continuations 8a to 10a, is directed slightly upwards in order to pass over the rim 6 of the crucible. It is understood that the electron guns 8, 9 and 10, including their housings, are disposed below a horizontal plane defined by the rim 6 of the crucible.

The radiation parameters of the electron guns 8, 9 and 10 are controlled by a control device 14, which essentially controls output. The control device 14 receives its control signals in turn from a microprocessor 15, into which the necessary data is entered by means of a data input device 16. From microprocessor 15, control lines also lead to amplifiers labelled "X" and "Y" which, in turn, supply the deflection currents for the deflecting systems accommodated in the housing continuations 8a, 9a and 10a. By means of the deflection currents, the electron beams 11, 12 and 13 can be deflected initially in the direction of an X-Y coordinate system, which can be imagined to be set up vertically between the electron guns 8, 9 and 10 and the vaporization crucible 1. Within the electron guns 8, 9 and 10 the electron beam (starting from a cathode) runs essentially linearly and also horizontally within a so-called beam-control tube of the type well known in the art. For this reason, the electron beams, at least when they are first formed, run parallel to one another and are also oriented in respective perpendicular planes extending through the crucible axis A—A. In their further paths, (outside of the electron guns 8, 9 and 10), the electron beams must be deflected onto the surface of the material 7 to be vaporized, the so-called "bath surface", as shown in the FIGURE.

For this purpose, an alternating serial arrangement of linear coils 17, 18 and 19 is disposed on the side of the vaporization crucible 1 opposite to the electron guns. Between these linear coils and at their ends there are pole plates 20, 21, 22 and 23, which are aligned at right angles to the crucible axis A—A, but end in the direction of the crucible immediately before its long side 3. The upper edges of the pole plates 20 to 23 are also disposed below a horizontal plane that passes through the rim 6 of the crucible. In this connection, the arrangement is made so that in each case two pole plates (for example, 20 and 21) at the ends of a linear coil (for example, 17) occupy such a position relative to an opposite electron gun (e.g. 8), that the beam axis (in a mid position of the electron beam) essentially is in a vertical plane of symmetry between these pole plates. This plane of symmetry runs perpendicularly to the crucible axis A—A. As already described further above, the electron beam, naturally starting out from this mid position, can be deflected according to a given deflecting pattern.

A magnetic field sensor 24, which energizes several amplifiers 26 via a controller 25 thereby to generate a defined deflecting current in the individual linear coils 17, 18 and 19, is assigned to the pole plate 23, which lies on the outside and to the right of the linear coils.

A deflecting magnetic field, substantial portions of which extend into the region above the material 7 to be vaporized, is generated between each of the two immediately adjacent pole plates (20/21; 21/22; 22/23) by the pole plates 20 to 23 in conjunction with the linear coils 17 to 19. These fields, which can also be referred to as stray fields, are indicated by the double arrows running parallel to the crucible axis A—A. In the region in which they interact with the electron beams 11, 12 and 13, the lines of flux in question run to a sufficient extent linearly and parallel to the aforementioned crucible axis A—A, as is likewise indicated by these double arrows.

Due to the agency of the three magnetic fields in the present case, the lines of flux of which run essentially perpendicularly to the paths of the electron beams 11, 12 and 13, these electron beams—as is evident from the FIGURE—are deflected on arched paths and directed onto the surface of the material 7 to be vaporized, the so-called bath surface. The magnetic fields (stray fields) also serve to accelerate the secondary electrons, generated on site of impact (cathode spot) of the respective electron beam, back in the direction of the bath surface, so that these secondary electrons also contribute additionally to heating the bath, but not to any undesirable heating of the substrate above the bath.

There has thus been shown and described a novel vaporization arrangement with a rectangular vaporization crucible and several electron guns which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

What is claimed is:

1. In a vaporization arrangement for coating substrates disposed in an areal region or passed through an areal region, said arrangement comprising a rectangular vaporization crucible with a crucible rim and a longitudinal crucible axis, as well as a plurality of electron guns, each of which has an X-Y deflection system, and which are disposed on one side of the crucible axis separately from the crucible in such a manner that their beam axes run parallel to one another and are directed along individual planes passing vertically through the crucible axis, the improvement comprising means for deflecting the electron beams onto the surface of the contents of the crucible, said means including an alternating serial arrangement of linear coils on the side of the crucible opposite to that of the electron guns, and pole plates disposed both between the linear coils and at their ends, two pole plates at the ends of a linear coil in each case having a position, relative to an opposite electron gun, such that the beam axis is substantially in a perpendicular plane of symmetry between said pole plates.

2. Vaporization arrangement as defined in claim 1, wherein said pole plates are disposed completely below a horizontal plane passing through the crucible rim.

3. Vaporization arrangement as defined in claim 1, wherein said electron guns are disposed completely below a horizontal plane passing through the crucible rim.

* * * * *